(12) United States Patent
Wen et al.

(10) Patent No.: US 10,194,558 B2
(45) Date of Patent: Jan. 29, 2019

(54) GAME CONTROLLER AND SECURE ENCLOSURE FOR AN ELECTRONIC GAMING MACHINE

(71) Applicant: Quixant PLC, Cambridgeshire (GB)

(72) Inventors: Frank Wen, New Taipei (TW); Hans Chou, New Taipei (TW)

(73) Assignee: QUIXANT PLC, Cambridgeshire (GB)

( * ) Notice: Subject to any disclaimer, the term of this patent is extended or adjusted under 35 U.S.C. 154(b) by 12 days.

(21) Appl. No.: 15/656,484

(22) Filed: Jul. 21, 2017

(65) Prior Publication Data

US 2018/0350190 A1    Dec. 6, 2018

(30) Foreign Application Priority Data

Jun. 2, 2017    (TW) .............................. 106207879 U

(51) Int. Cl.
*H05K 7/20* (2006.01)
*G06F 1/20* (2006.01)
*G07F 17/32* (2006.01)
*A63F 13/90* (2014.01)

(52) U.S. Cl.
CPC ..... *H05K 7/20154* (2013.01); *G07F 17/3216* (2013.01); *G07F 17/3241* (2013.01); *A63F 13/90* (2014.09); *G06F 1/20* (2013.01); *H05K 7/20336* (2013.01)

(58) Field of Classification Search
CPC ....... H05K 7/20136–7/20154; H05K 7/20336; G06F 1/20; A63F 13/08; A63F 13/23; A63F 13/90; A63F 2300/301; A63F 2300/8088; H04B 1/08; H04N 21/40; Y10S 174/09; Y10S 312/00; G07F 17/3421

USPC .............. 361/695–697, 700; 165/80.1–80.5, 165/104.33
See application file for complete search history.

(56) References Cited

U.S. PATENT DOCUMENTS 6,439,992 B1 *   8/2002   Demeter .............. H05K 5/0286
                                               361/694
6,699,128 B1 *   3/2004   Beadell .................. G07F 17/32
                                               292/106
7,518,862 B1 *   4/2009   Macika ..................... G06F 1/20
                                               361/688

(Continued)

OTHER PUBLICATIONS

"Translation of the Taiwanese application used to claim foreign priority with the filing receipt and inventor certificate", 34 pages.

*Primary Examiner* — Zachary Pape
(74) *Attorney, Agent, or Firm* — Kwan & Olynick LLP

(57) ABSTRACT

Various embodiments of the present invention generally relate to operating an electronic gaming machine to generate a wager-based game. A game control unit including a secure enclosure are provided. The secure enclosure is divided into two compartments. The first compartment securely contains the game control unit, which includes a game controller used to generate the wager-based game and heat dissipation units. The second compartment includes two fans and is accessed by an easily removable magnetically attached cover. The fans and heat dissipation units provide cooling for electrical components associated with the game controller. The fans can be maintained and replaced without compromising the security of the game controller. This feature reduces costs associated with maintaining the electronic gaming machine.

20 Claims, 11 Drawing Sheets

(56) References Cited

U.S. PATENT DOCUMENTS

| | | | |
|---|---|---|---|
| 8,303,419 B2* | 11/2012 | Landsman | G06F 1/206 463/46 |
| 9,811,969 B2* | 11/2017 | Salzman | G07F 17/3216 |
| 2008/0009353 A1* | 1/2008 | Halic | G07F 17/32 463/46 |
| 2009/0005178 A1* | 1/2009 | Abe | G07F 17/32 463/46 |
| 2009/0194260 A1* | 8/2009 | Liao | H01L 23/4006 165/104.33 |
| 2011/0092283 A1* | 4/2011 | Levitan | A63F 13/08 463/31 |
| 2013/0303264 A1* | 11/2013 | Gill | G07F 17/3216 463/25 |

* cited by examiner

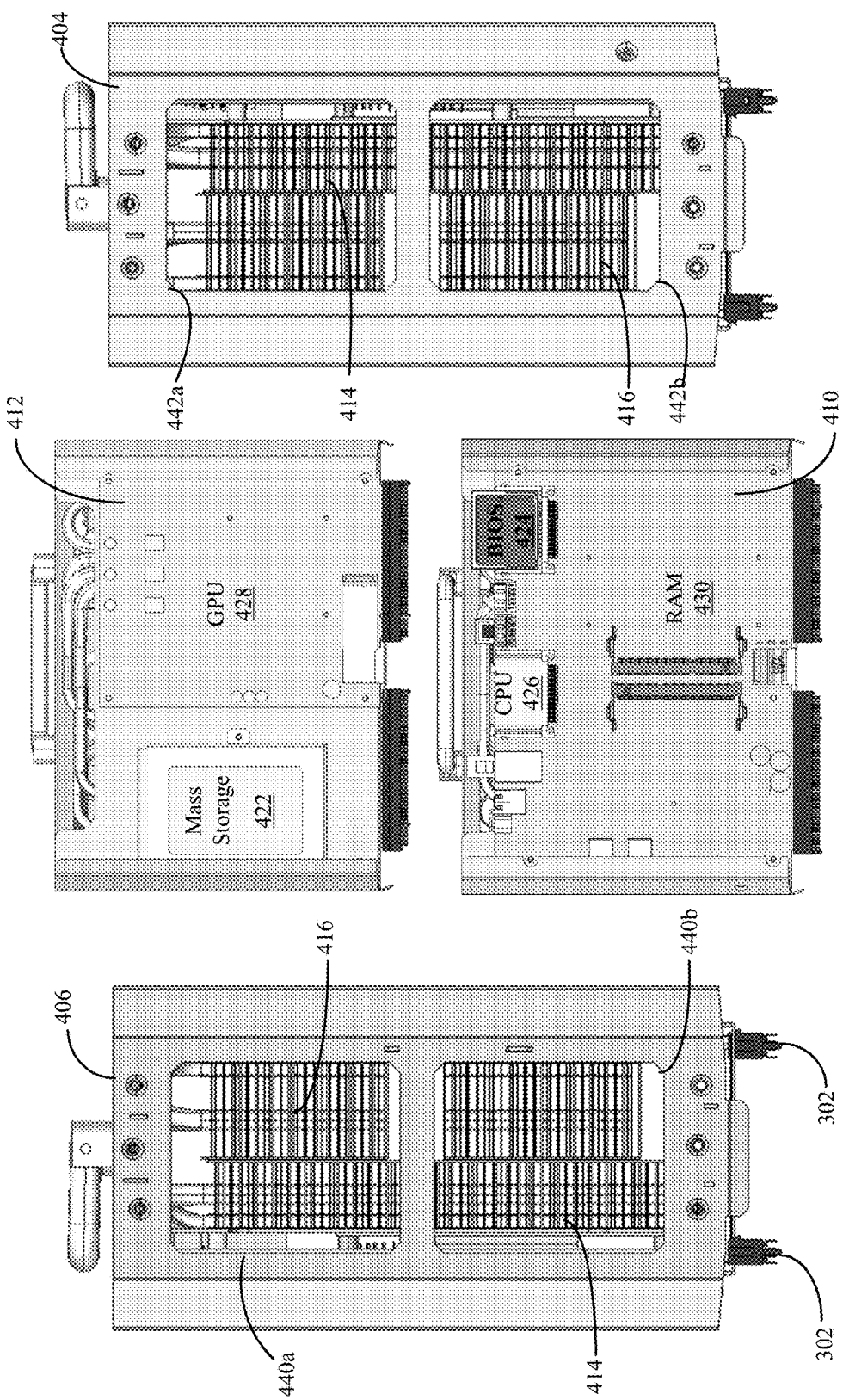

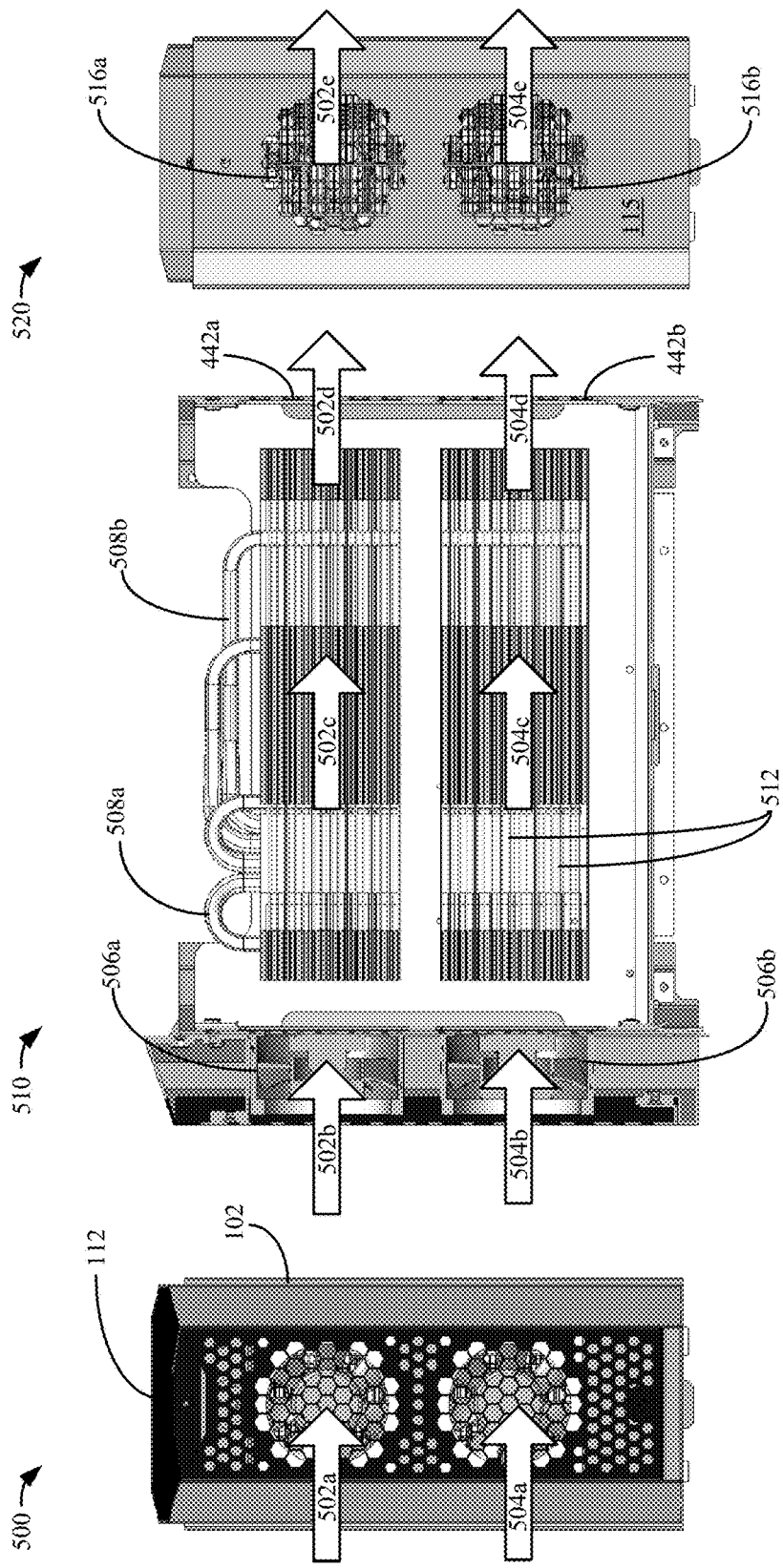

GAME CONTROLLER AND SECURE ENCLOSURE FOR AN ELECTRONIC GAMING MACHINE

CROSS REFERENCE TO RELATED APPLICATIONS

The present application claims priority under 35 USC 119 to Taiwan Patent Application no. 106207879, filed Jun. 2, 2017, titled, "Computer Apparatus and Fan Device Thereof," which is incorporated in its entirety and for all purposes.

TECHNICAL FIELD

The present disclosure relates to electronic gaming machines which are designed to provide players with wager-based games. In particular, the present disclosure relates to game controllers integrated inside a secure enclosure used to generate the wager-based game.

Electronic gaming machines, such as video slot reel and mechanical reel-based devices are popular entertainment devices in casinos. Electronic gaming machines use a game controller to generate and present an outcome of a wager-based game to a player. The game controller is mounted within a gaming cabinet associated with the electronic gaming machine and is connected to the various input/output on the gaming machine, such as displays, input buttons, a bill validator and a printer.

The game controller is kept within a discrete secure enclosure within the gaming cabinet. The secure enclosure prevents tampering with the game software executed by the game controller as well as the electronics, both of which could potentially affect the outcome of the game. When the secure enclosure in which the game controller is located is opened, such as to perform maintenance on the game controller, a service technician and security personnel are required to be present, which entails high-labor costs. In view of the above, new designs of the secure enclosures for game controllers are desired which minimize maintenance related labor costs.

OVERVIEW

Various embodiments of the present invention generally relate to operating an electronic gaming machine (EGM) to generate a wager-based game. In particular, a game controller unit (GCU) and secure enclosure which can be installed within a gaming cabinet of the EGM is described. The game controller unit can include a game controller, which executes gaming software to control operation of the EGM.

The GCU is typically mounted within a secure enclosure. In particular, the secure enclosure can be mounted to a backplane where the backplane is mounted to an interior wall of the gaming cabinet associated with the EGM. The backplane can include connectors that allow the GCU to communicate with various input/output (I/O) devices, receive power and monitor various security sensors within the gaming cabinet.

In particular embodiments, a gaming system can be provided. The gaming system can be generally characterized as including an enclosure and a GCU. The enclosure can include two compartments. The first compartment can be accessed via a door including a locking mechanism. The compartment can be accessed via a cover. In some embodiments, the cover can be removed by hand. The first and second compartments are mechanically isolated from each other except for the provision of apertures to enable air to flow between the compartments.

The GCU can be disposed within the first compartment of the enclosure. The GCU can include a frame, one or more heat dissipation units coupled to the frame, a plurality of electrical circuit boards coupled to the outside of the heat dissipation units adjacent to walls of the enclosure. The plurality of electrical circuit boards can form a game controller that executes the game software to control a wager-based game played on an electronic gaming machine. The game controller can include a CPU, GPU, RAM, BIOS and a mass storage device which stores game software.

A first fan can be disposed within the second compartment. In addition, a first plurality of apertures can be formed between the first compartment and the second compartment. The first plurality of apertures allow air, driven by the first fan, to move between the first compartment and the second compartment to cause heat from the heat dissipation units to be removed from the first compartment. The heat dissipation units in the first compartment can be disposed adjacent to a first side of the first plurality of apertures such, such that when the door to the first compartment is locked via the locking mechanism and the cover and the first fan is removed from the second compartment for servicing the first fan, the game controller is not exposed tampering allowing the first fan to be serviced by a service technician without a presence of security personnel.

In particular embodiments, the cover for the second compartment is attached via magnets, allowing the cover to be removed by hand without the use of tools. Alternatively, the cover is configured to be slid into a track, allowing the cover to be removed by hand without the use of tools. The cover can include a second plurality of apertures allowing air to move between outside of the enclosure and the second compartment.

In other embodiments, a second fan and a second plurality of apertures can be provided. The second plurality of apertures between the first compartment and the second compartment, can allow air driven by the second fan, to move between the first compartment and the second compartment to cause heat from the heat dissipation units to be removed from the first compartment. In a particular embodiment, a frame, which couples the first fan to the second fan, can be provided which allows the first fan and the second fan to be removed as a single unit. In another embodiment, the first fan is coupled to the cover to allow the first fan and the cover to be removed as a single unit.

A power and data connector located inside of the second compartment can be provided. The power and data connector can be configured to provide power and provide communications with the fan. The wires to the power and data connector can be routed outside of the first compartment.

Further, one or more mounting posts perpendicular to a bottom of the second compartment can be provided. The one or more mounting can be configured to receive the fan and secure it to the enclosure. In one embodiment, the first fan can be magnetically secured to the enclosure. In addition, a filter can be disposed between a bottom of the fan and the first plurality of apertures.

Another aspect of the disclosure can relate to a method of servicing an electronic gaming machine (EGM) including a cabinet. The method can be generally characterized as providing 1) an enclosure including two compartments, secured within an interior portion of the cabinet of the EGM, where a first compartment is accessed via a door including a locking mechanism and an intrusion monitoring switch to detect access and where a second compartment is secured via a cover; 2) a game control unit, locked, via the locking mechanism, within the first compartment of the enclosure, including a frame, two heat dissipation units coupled to the frame, a plurality of electrical circuit boards forming a game controller, coupled to an outside of the heat dissipation units adjacent to walls of the enclosure, wherein the game controller includes a CPU, GPU, RAM, BIOS and a mass storage device storing game software and wherein the game controller executes the game software to control a wager-based game played on the EGM; 3) a first fan disposed within the second compartment; and 4) a first plurality of apertures, between the first compartment and the second compartment, which allow air driven by the first fan, to move between the first compartment and the second compartment to cause heat from the heat dissipation units to be removed from the first compartment; wherein the heat dissipation units in the first compartment are disposed adjacent to a first side of the first plurality of apertures such, such that when the door to the first compartment is locked via the locking mechanism and the cover and the first fan is removed from the second compartment for servicing the first fan, the game controller is not exposed tampering.

The servicing method can include 1) opening a door to the cabinet of the EGM, 2) while the door to the first compartment remains locked with the game control unit secure in the first compartment, removing the cover to the second compartment; 3) removing the first fan from the second compartment; 4) replacing the first fan with a replacement part, such as a second fan; 5) placing the cover over the second compartment; and 6) closing the cabinet. In particular embodiment, the cover can be magnetically coupled to the enclosure allowing the cover to be removed by hand.

One embodiment of the invention can be generally characterized as a device. The device can include an enclosure with two compartments. A first compartment can be accessed via a door including a locking mechanism and a second compartment can be secured via a cover.

A game control unit can be disposed within the first compartment of the enclosure. The game control unit can include 1) a frame, 2) a first dissipation unit, 3) a second heat dissipation unit, 4) a first circuit board, 5) a second circuit board, 6) a game controller and 7) a first fan. The first heat dissipation units can be coupled to the frame. The first heat dissipation unit can have a first plate with first fins extending from the first plate.

The second heat dissipation unit can also be coupled to the frame. The second heat dissipation unit can have a second plate with second fins extending from the second plate. The ends of the first fins can substantially reach ends of the second fins without overlap between the first fins and the second fins. In one embodiment, the first fins and second fins can overlap one another. In a particular embodiment, a third plate can be coupled to the ends of the first fins and a fourth plate can be coupled to the ends of the second fins. In this embodiment, the third plate and the fourth plate can substantially contact one another. In one embodiment, the third plate can only cover a portion of the ends of the first fins and the fourth plate can only covers a portion of the ends of the second fins to allow air to move between the first fins and the second fins.

The first circuit board can include at least a CPU mounted to the first plate, on a side opposite the first fins, between the first plate and a first wall of the enclosure forming the first compartment. The first fins can be configured to dissipate heat from the CPU. The second circuit board can include at least a GPU mounted to the second plate, on a side opposite the second fins, between the second plate and a second wall of the enclosure forming the first compartment. The second fins can be configured to dissipate heat from the GPU. The game controller can include the CPU, the GPU, the first circuit board, the second circuit board, RAM, a BIOS and a mass storage device storing game software. The game controller can execute the game software to control a wager-based game played on an electronic gaming machine.

The first fan can be disposed within the second compartment. A first plurality of apertures, between the first compartment and the second compartment can allow air driven by the first fan to move between the first compartment and the second compartment. The movement of the air can cause heat from the first heat dissipation unit and the second heat dissipation unit to be removed from the first compartment.

In particular embodiments, a first distance, measured perpendicularly from the first plate, between the first plate and the ends of the first fins is unequal to a second distance, measured perpendicularly from the second plate, between the ends of the second fins and the second plate. The second distance can be greater than the first distance. The first fins can extend perpendicularly from the first plate and the second fins can extend perpendicularly from the second plate. One or more of a first angle between the first fins and the first plate or a second angle between the second plate and the second fins can be less than ninety degrees.

In yet other embodiments, the second fins can be grouped into a first set of fins and a second set of fins. A gap can be provided between the first set of fins and the second set of fins. The gap can be significantly greater than either a first spacing between fins in the first set of fins or a second spacing between fins in the second set of fins.

A first plurality of heat pipes can pass through the first fins and a second plurality of heat pipes can pass through the second fins. A first number of the first plurality of heat pipes can be different than a second number of the second plurality of heat pipes. In particular, the second number can be greater than the first number. The second plurality of heat pipes can pass through the second fins with gaps between each of the second plurality of heat pipes. The first plurality of heat pipes can pass through the first fins at locations that align with the gaps between the each of the second plurality of heat pipes.

In yet other embodiments, a first spacing between each of the first fins can be different than a second spacing between each of the second fins. Further, a total number of the first fins can be different than a total number of the second fins. The frame includes a first end plate with a first plurality of apertures configured to receive air flow and a second end plate with a second plurality of apertures configured to receive the air flow. The sides of the first heat dissipation unit and the second heat dissipation unit can be positioned adjacent to the first plurality of apertures and the second plurality of apertures to block tampering with the first circuit board or the second circuit board.

BRIEF DESCRIPTION OF THE DRAWINGS

The disclosure may best be understood by reference to the following description taken in conjunction with the accompanying drawings, which illustrate particular embodiments of the present invention.

FIG. 6A, 6B and 6C illustrate side views of a game controller unit in accordance with embodiments of the present invention.

FIGS. 7A and 7C illustrate top and bottom views of a secure enclosure for a game controller unit in accordance with embodiments of the present invention.

FIG. 7B illustrate a cross sectional view of a secure enclosure with a game controller unit inserted in accordance with embodiments of the present invention.

DETAILED DESCRIPTION

Reference will now be made in detail to some specific examples of the invention including the best modes contemplated by the inventors for carrying out the invention. Examples of these specific embodiments are illustrated in the accompanying drawings. While the present disclosure is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular embodiments of the present invention may be implemented without some or all of these specific details. In other instances, well known process operations have not been described in detail in order not to unnecessarily obscure the present invention.

In general, gaming systems which provide wager-based games are described. In particular, a game controller unit (GCU) and secure enclosure which can be installed within a gaming cabinet of an electronic gaming machine (EGM) is described. The game controller unit can include a game controller, which executes gaming software to control operation of the EGM.

The GCU can include a game controller with a CPU board and a GPU board and a heat dissipation system. The GCU can be configured to be mounted within a secure enclosure. The secure enclosure can be mounted to a backplane. The backplane can include connectors that allow the GCU to communicate with various input/output (I/O) devices on an EGM, receive power and monitor various security sensors. The backplane can be secured to one of the walls within an interior of an EGM cabinet.

Figures 1A, 1B:
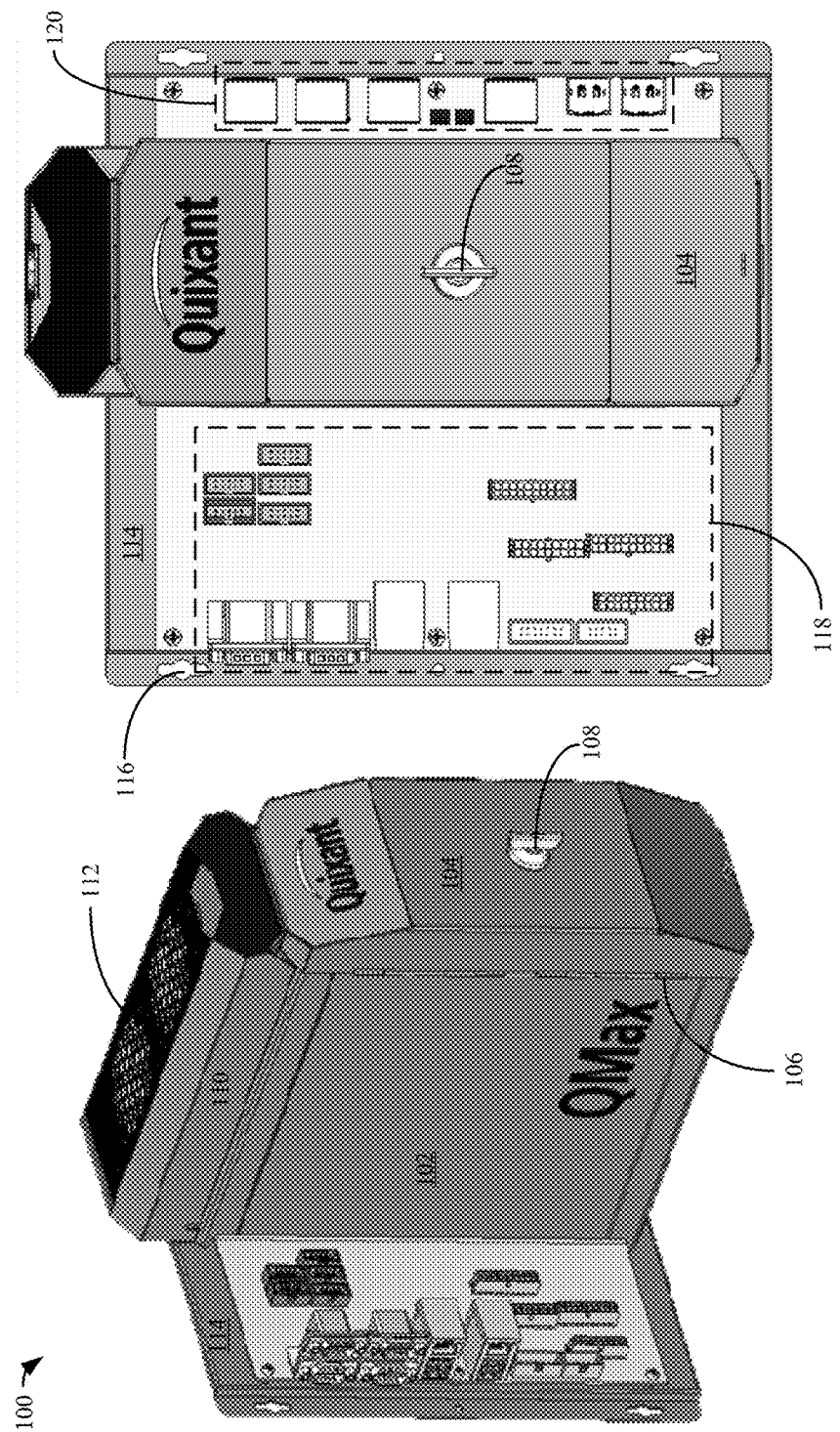
FIGS. 1A and 1B illustrate a perspective and front view of a secure enclosure and backplane for an electronic gaming machine in accordance with embodiments of the present invention.

In more detail, with respect to FIGS. 1A and 1B, a perspective and front view of a secure enclosure and backplane for an EGM are described. The GCU can reside within the secure enclosure. With respect to FIG. 2, an EGM, which can be controlled by a GCU, is discussed. A block diagram of a game controller which can be utilized in a GCU is described with respect to FIG. 3.

Figure 4A:
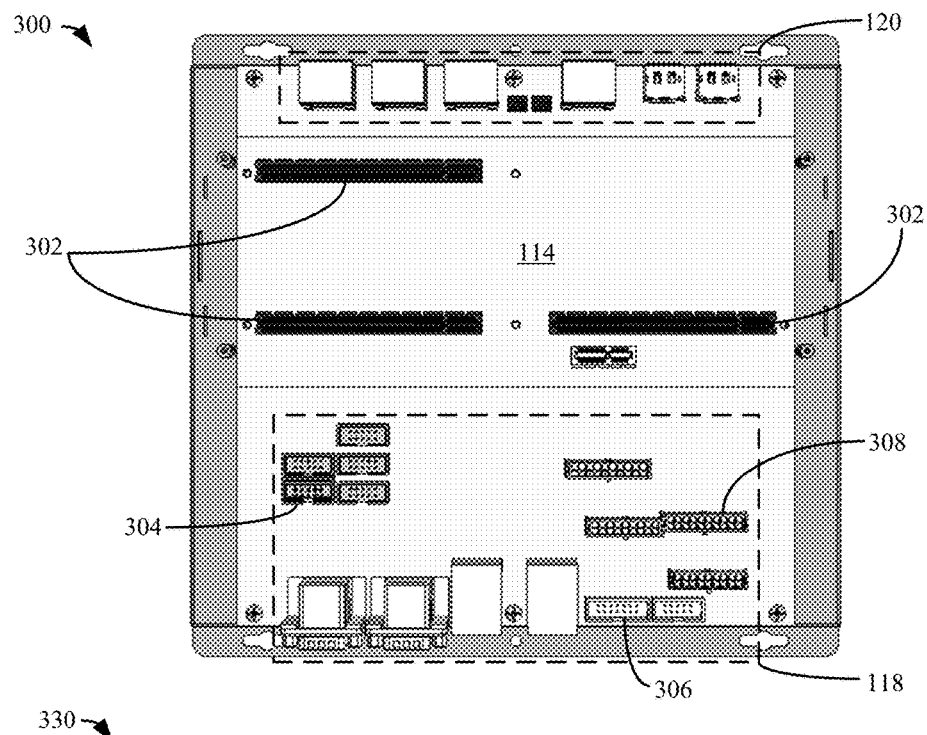
FIGS. 4A, 4B and 4C illustrate top and side views of a backplane for an electronic gaming machine in accordance with embodiments of the present invention.
Figure 4B:
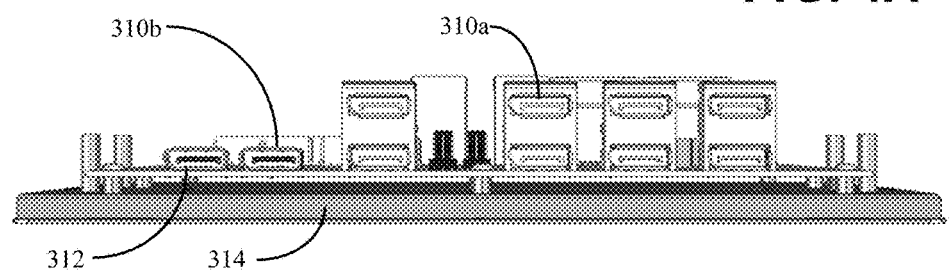
Figure 4C:
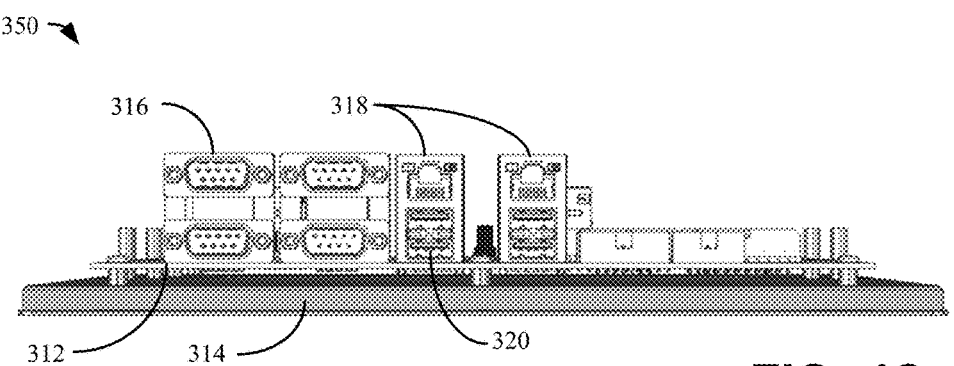

With respect to FIGS. 4A, 4B and 4C, a backplane for an EGM is discussed. With respect to FIGS. 5A to 6C, a GCU, which can be installed within a secure enclosure mounted to a backplane, is described. The GCU includes components, such as not limited to CPU board, a GPU board, heat dissipation system and a frame.

With respect to FIGS. 7A to 9B, a heat dissipation system of the GCU is described. In particular, with respect to FIGS. 7A, 7B and 7C, air flow patterns through the secure enclosure and GCU are discussed. With respect to FIG. 8, a fan cover, fans and a fan enclosure associated with the secure enclosure are discussed. The fan cover, fans and fan enclosure are part of the heat dissipation system. With respect to FIGS. 9A and 9B, two heat dissipating units for a game controller unit are described.

Figure 10:
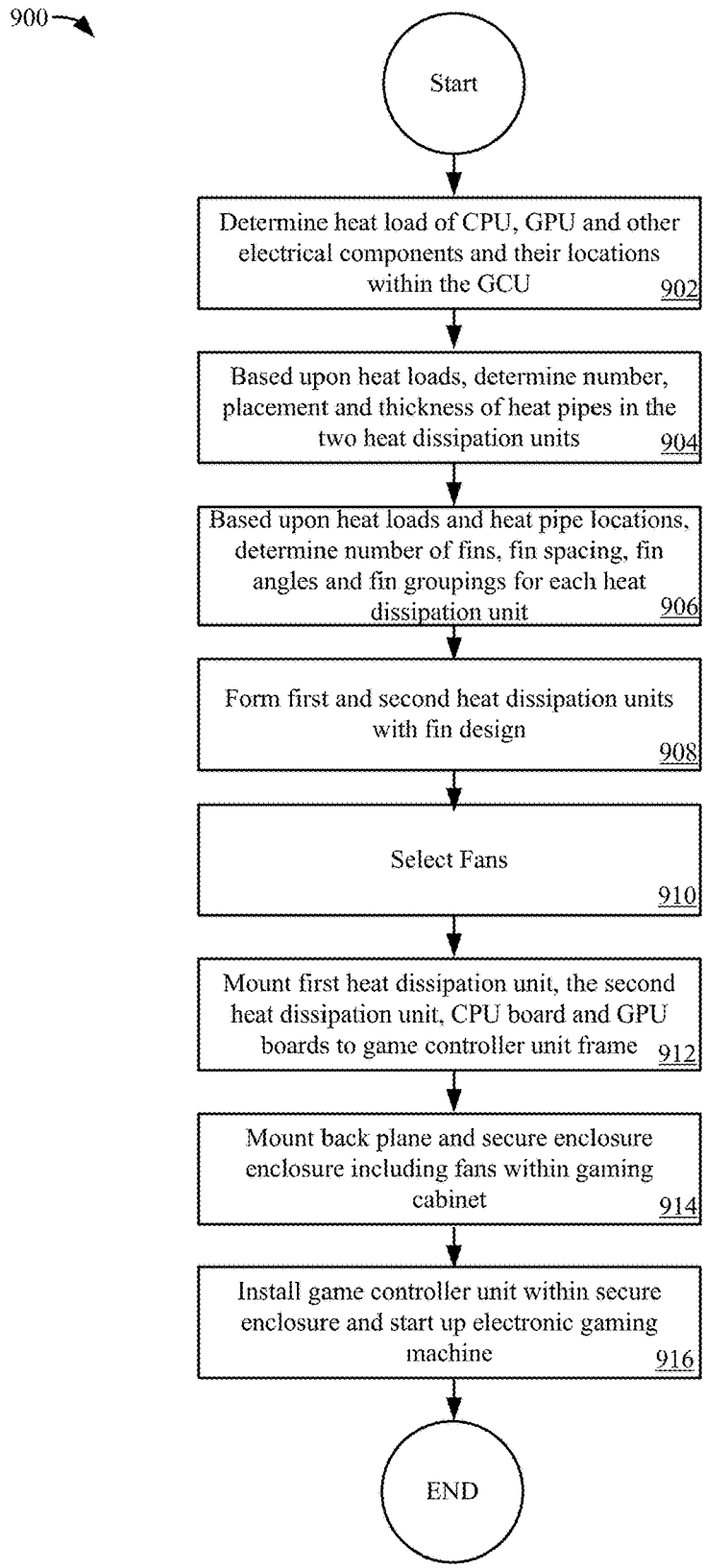
FIG. 10 illustrates a method of replacing a fan coupled to a secure enclosure for a game control unit in accordance with the present invention.
Figure 11:
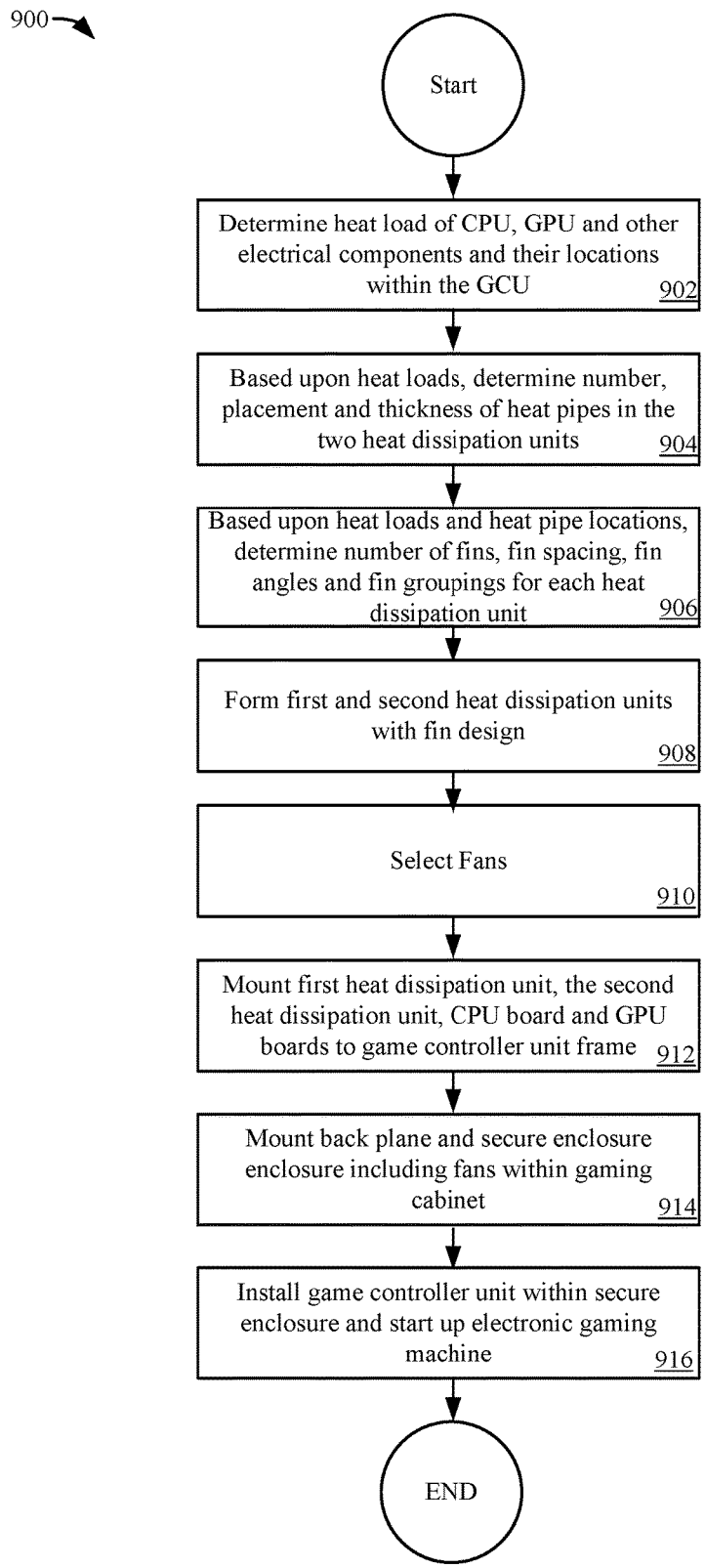
FIG. 11 illustrates a method of forming a game controller unit including CPU and GPU boards and CPU and GPU heat dissipation units in accordance with the present invention.

With respect to FIG. 10, a method of replacing a fan coupled to a secure enclosure for a game controller. The fan can be replaced without opening a portion of the secure enclosure including the GCU. This feature allows a technician to perform the operation without the presence additional security personnel. Finally, FIG. 11 illustrates a method of forming a GCU unit including CPU and GPU boards and heat dissipation units.

Details of the aforementioned figures are now described. FIGS. 1A and 1B illustrate a perspective and front view of a secure enclosure and backplane for an EGM. In FIGS. 1A and 1B, a system 100 includes the backplane 114 and a secure enclosure 102. The backplane 114 is mounted within a cabinet associated with an EGM. The secure enclosure 102 is mounted on the backplane 114.

Fasteners, such as screws, can be inserted through apertures, such as 116, in the backplane to secure the backplane 114 to an interior wall of the cabinet. The backplane 114 and secure enclosure 102 can be secured to a wall of the cabinet in an upright orientation on a sidewall, such as shown in FIG. 1B. In alternate embodiments, the backplane and enclosure can be rotated ninety degrees or by some other angle and secured to an interior wall. Further, the backplane and enclosure can be mounted on a top wall of the cabinet such that it is hanging down or a bottom wall such that it extends upwards.

In one embodiment, the backplane 114 can be approximately 260 mm by 252 mm. The dimension of enclosure 102 can be approximately 292 mm high by 104 mm wide. The depth of the enclosure (into the page) can be about 247 mm. The dimensions allow the backplane 114 and enclosure 102 to be installed into a wide variety of gaming cabinets. Other dimensions are possible and these dimensions are provided for the purposes of illustration only.

The enclosure 102 can include a top portion 110. The top portion 110 can enclose one or more fans. In this example, two fans are secured with the enclosure. The top portion includes a cover 112. The cover 112 as will be discussed in more detail can be removed to allow the fans to be accessed and if necessary replaced. The covers 112 include apertures which allow air to be pulled through the fans and into the enclosure 102 or air to be pulled out of the enclosure. The air flow can be used for cooling electrical components within the enclosure, such as but not limited to a CPU and a GPU.

The enclosure 102 includes a door 104 coupled to hinges 106. The door 104 swings open on the hinges 106 to allow a GCU to be inserted or removed from the enclosure (see FIG. 5C). The door 104 can include a locking mechanism 108. The locking mechanism 108 can be coupled to a security sensor, which detects when the locking mechanism is utilized. Typically, when the GCU is accessed in field via opening of the door 104, a technician and e security personnel are required to be present.

The backplane 114 includes areas 118 and 120 on either side of the enclosure 102. Areas 118 and 120 include connectors. The connectors in each area can be coupled to a backplane board. The backplane board provides an interface to the GCU. Via the interface, a game controller on the GCU can communicate with devices coupled to the connectors on the backplane. Some examples of devices which can be coupled to the connectors are described as follows with respect to FIG. 2. Additional details of the connectors are described in more detail with respect to FIGS. 4A, 4B and 4C.

Figure 2:
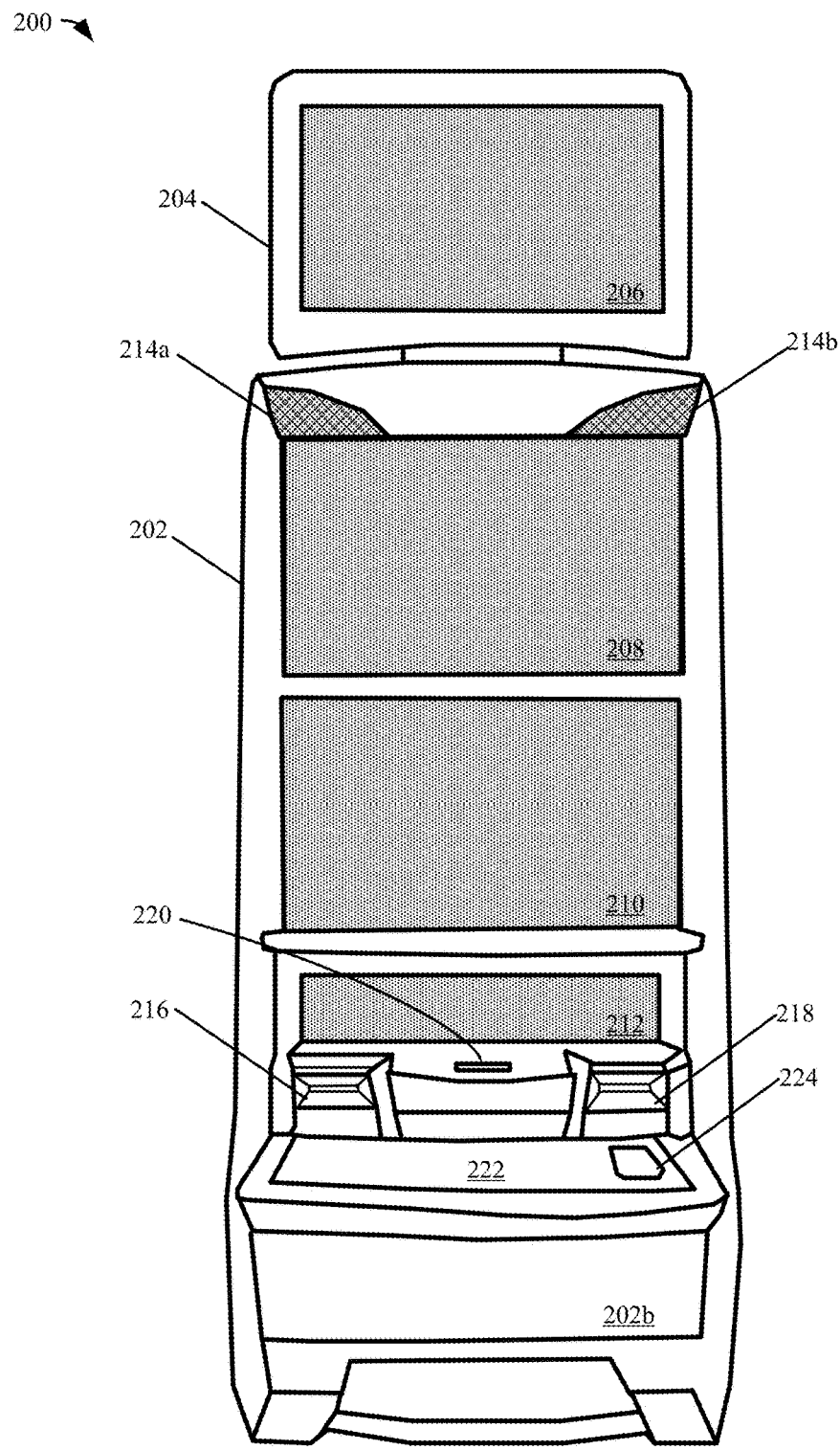
FIG. 2 illustrates an electronic gaming machine in accordance with embodiments of the present invention.

FIG. 2 illustrates an example of an EGM 200, which can include the backplane and secure enclosure described above with respect to FIGS. 1A and 1B. A GCU within the secure enclosure can be configured to operate the EGM 200 to play a wager-based game. Examples of wager-based games with which the GCU can be utilized include but are not limited to video slot games, mechanical slot games, card games (e.g., poker and black jack), lottery games and bingo games.

The EGM 200 includes a main cabinet 202 and a top box 204. The main cabinet 202 can include a door with a locking mechanism. The door can allow access to an interior of the main cabinet. As described above, the backplane, the secure enclosure for the GCU and the GCU can be located within the main cabinet. In an alternate embodiment, the backplane, the secure enclosure for the GCU and the GCU can be located within a top box, such as 204.

The locking mechanisms can be monitored by one or more security sensors. The security sensors can be configured to send data to the GCU. Typically, the GCU will enter a tilt mode when the door to the interior of the gaming cabinet is opened. In a tilt mode, game play on the EGM 200 can be suspended.

The EGM 200 includes displays 206, 208, 210 and 212 and speakers 214a and 214b. The displays and speakers can be used to output video and audio content associated with a wager-based game played on the EGM 200 including a primary game and a bonus game. Further, the displays and speakers can be used to output alternate content, such as advertising, player tracking services or other casino services. In one embodiment, display 212 can be used to provide player tracking services. All or a portion of displays 206, 208, 210 and 212 can be touch screens.

The EGM 200 includes an interface 218 to a bill validator 218. The bill validator 218 can be configured to accept cash or printed tickets. The bill validator can confirm deposited currency is real, determine its denomination and store it in a box coupled to the bill validator. The currency can be used to deposit credits on the EGM 200. The credits can be used to play a wager-based game on the EGM.

Further, the bill validator can read information from a printed ticket. The printed ticket can be redeemed from some amount of credit. The bill validator can read information from the printed ticket and send it to the GCU. The information can be sent to a remote server. The remote server can validate the printed ticket for an amount of credits, which is then deposited on the EGM.

In one embodiment, the bill validator can include a wireless interface. Via the wireless interface, the bill validator can communicate with a portable electronic device, such as a smart phone. In one embodiment, via the smart phone, an electronic transfer of credits can be made to the EGM via the bill validator.

The printer interface 216 can allow printed tickets to be dispensed from the EGM 200. A ticket can be printed to cash out an amount of credits remaining on the EGM. The printed ticket can be redeemed for cash or used to deposit credits on another EGM. The EGM 200 and its associated game controller can communicate with a remote server to both validate previously printed tickets and generate new printed tickets.

A game controller with the cabinet can monitor the bill validator and printer for error conditions. Error conditions can involve an attempt to tamper with the devices, which can be detected and reported by the devices to the game controller. Further, for the printer, conditions, such as paper jam, low paper or malfunctions can be reported to the game controller (see 250 in FIG. 3). For the bill validator, conditions, such as jams, counterfeit attempts or a high fill level of the bill stacker can be reported to the game controller. In response, the game controller can optionally place the EGM 200 in a tilt condition and/or request service for the gaming machine.

The EGM 200 can include a card reader 220 configured to read a magnetic striped card, a chip card and/or a card with a printed bar-code. The card reader 220 can also include a wireless interface for communicating with a smart phone. The card reader 220 can be a stand-alone unit or can be part of a player tracking unit. In some instances, the card reader 220 can be configured to communicate directly with a game controller, such as to send information read from a card to the game controller or receive commands from the game controller.

In other instances, the card reader can be configured to communicate with a player tracking controller. The player tracking controller can provide loyalty program services, such as awarding comps to a player or associating game play on the EGM 200 with a particular player account. In one embodiment, the player tracking controller can be configured to control a display, such as 212 and the card reader 220, to provide player tracking services. This function can also be done by the game controller.

When present, the player tracking controller can be configured receive information from the card reader and send commands to the card reader. Further, the player tracking controller can also be configured to communicate with the game controller and a remote server. The player tracking controller can communicate with the game controller to send information read from a card in the card reader 220 and to deposit credits on the EGM. Further, the player tracking controller can receive game play information from the game controller, such as amounts wagered and won.

When a card is inserted into the card reader, the player tracking controller (or game controller) can communicate with a remote server to determine whether a player tracking account is associated with the card. When the card information is validated, game play information can be sent to remote server and stored in a player tracking account associated with card. Based upon a player's previous game play information stored in a player tracking account on a remote server, awards, such as credits, can be deposited on the EGM 200.

Game play decisions, such as an amount to wager, initiating a game, making game play selections (e.g., selecting cards in a card game or choices in a bonus game), can be made via a player input panel 222. In this example, the player input panel 222 includes a display and a touch surface and a mechanical button 224. The display and touch surface can be used to output selectable buttons that can be used to play a game. The mechanical button 224 can be used to make a game choice, such as initiating game or a cash out. The inputs from the player input panel 222 and mechanical button 224 can be sent to the game controller inside the cabinet.

In alternate embodiments, rather than a touch screen and display, a plurality of input buttons can be provided to make game decisions. In some instance, the input buttons can include built-in displays which can be used to change the functions of the buttons. Besides the input panel 222, one or more of the displays, such as 208, 210 and 212 can include touch screens. The touch screens in conjunction with the display can be used to make game play decisions under control of the game controller.

The displays, speakers, bill validator, printer, buttons, touch screens and card reader can be coupled to the backplane described above with respect to FIGS. 1A and 1B. Via the backplane interface, the game controller on the GCU can communicate with these devices including sending commands to the devices and receiving information from the devices to implement various functions, such as those described above.

Other devices (not shown) can be coupled to EGM. These devices can be coupled to the game controller on the GCU via the backplane. Some examples of these devices can include but are not limited to a coin acceptor, reels, wheels, coin dispensers, lighting devices, a candle used to summon attention to a gaming machine, wireless and wired communication interfaces and bonus devices.

Figure 3:
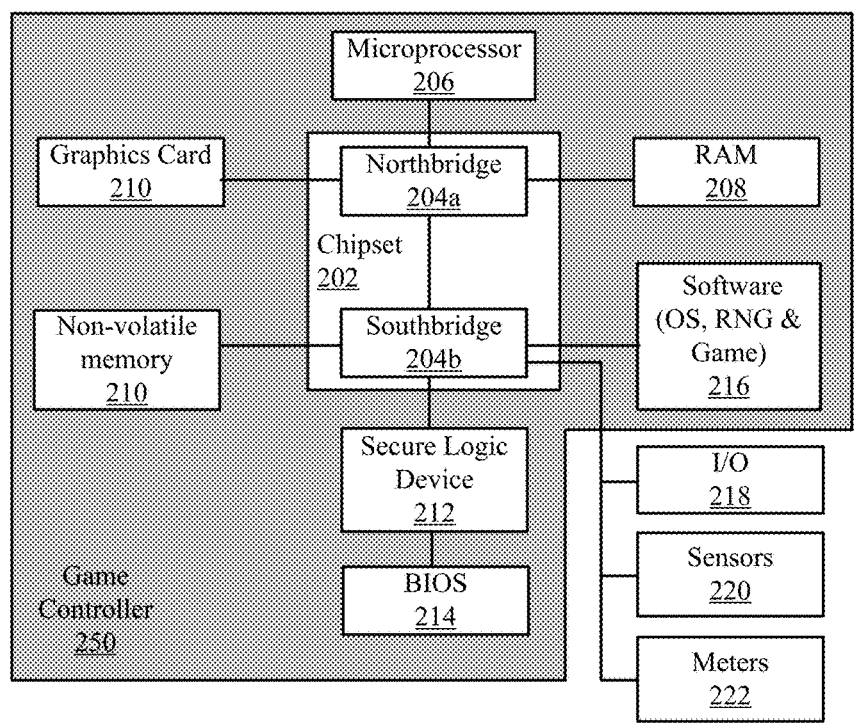
FIG. 3 illustrates a block diagram of a game controller for an electronic gaming machine coupled to various devices in accordance with embodiments of the present invention.

Next, a block diagram of a game controller, which can be incorporated into a GCU, is described. FIG. 3 illustrates a block diagram a system 240 including a game controller 250 coupled to gaming devices on an EGM, such as the EGM 200 described above in FIG. 2. The game controller 250 can embodied as one or more circuit boards. The circuit boards can include various electric components which are described in more detail below.

In one embodiment, a first board can include a chipset 202. The chip set 202 can include a northbridge 204a and a southbridge 204b. The northbridge 204a can provide: 1) a front-side bus which allows communication with one or more CPUs, such as microprocessor 206, 2) memory bus, which allows communications with RAM chips placed in memory slots and 3) a high-speed graphics bus. The high speed graphics bus can be an accelerated graphics port or a PCI express.

Between the northbridge 204a and the southbridge 204b can be an internal bus. The southbridge 204b can provide an I/O controller hub. In addition, the southbridge 204b can communicate with a PCI bus including PCI slots, can provide communications to devices compatible with IDE, SATA, USB, Ethernet, audio codec and CMOS memory and can provide a low pin count bus. For example, a mass storage device, such as a flash drive or hard drive, can communicate with the chip set 202 via the southbridge 204b. The mass storage device can include game software 216. The game software can include an operating system, a random number generator used to generate random numbers for a wager-based game and game software for generating a wager-based game played on the EGM, such as graphics software and paytables.

Via the southbridge 204b, the game controller 250 can communicate with I/O devices, such as displays, reels, wheels, lighting devices, speakers, an audio amplifier, input buttons, touch screens, a bill validator, printer, card reader, player tracking unit and communication interfaces. The communication interfaces can allow communications between remote servers and the game controller 250, such as servers providing accounting services, ticket-in/ticket-out services, player tracking services and progressive game services. In addition, sensors 220 and hard meters 222 can be coupled to the chip set via the southbridge 204b.

The sensors 220 can be security sensors, such as sensors which monitor actuation of locks, access to an interior of the gaming machine and access to the secure enclosure including the GCU. In addition, the game controller 250 can receive sensor data from various devices, such as the bill validator and printer. The sensor data can identify conditions which need attention, such as a paper jam or low paper in a printer or a full stacker associated with the bill validator. In response to data from the sensors 220, the game controller 250 can be configured to execute various responses, such as requesting maintenance from a technician or placing the EGM into a tilt condition.

The meters 222 can be mechanical devices which record various activities happening on the EGM, such as amount of cash/credit deposited on or dispensed from the EGM. These devices are often referred to "hard" meters. In addition, the software 216 can maintain a number of "soft" meters. The soft meters can be maintained via the software 216 and can also include records of activity on the EGM.

Also, via the southbridge 204b, the chip set 202 can communicate with a non-volatile memory 210. The non-volatile memory can be configured to store critical game data. Typically, wager-based games are implemented as state machines where each time a state is implemented, critical information associated with the state is stored to the non-volatile memory before advancing to the next state. In the event of a malfunction, such as a loss of power, the game controller 250 can be configured to recall critical information from the non-volatile memory 210 and restore to the EGM to its state prior to the malfunction. Examples of critical information can include credits on the EGM, an amount wagered, a current state of a wager-based game played on the EGM and soft meter information.

The non-volatile memory 210, to allow information to be stored in an event of a power-hit, typically requires a fast write times. One such type of memory, which has suitable write characteristics, is a battery-backed RAM. The battery-backed RAM is often referred to as a non-volatile RAM. Typically, memory in RAM is lost when power is lost. The battery supplies power to the RAM so that the information persists in the event of power loss. The game controller 250 can monitor the battery level to ensure the critical data in the NV-RAM preserved and the battery is replaced as necessary. For security and data integrity, multiple copies of critical data can be stored in the NV-RAM. Further, the critical data can also be encrypted if desired.

In an alternate embodiment, one or all of the non-volatile memory 210, the I/O 218, the sensors 220 and the meters can be coupled to the secure logic device 212. Thus, these components can communicate with the southbridge 204b via the secure logic device 212. For example, the secure logic device 212 can be interposed between in the communication path between the southbridge 204b and the non-volatile memory 210.

Via the low pin count bus, communications can be carried out with super I/O, such as a serial port, parallel port, floppy disk, keyboard and mouse. Also, via the low pin count bus or another bus, such as a USB, communications can be carried out with a secure logic device 212 and the BIOS 214. The secure logic device 212 can be used to provide various security functions, such as validating information stored on the BIOS 214 and decrypting information stored on the BIOS.

Next, with respect to FIGS. 4A, 4B and 4C, details of the back plane are described. The backplane can provide interfaces which allow various gaming devices to be coupled to the game controller 250 described above with respect to FIG. 3. Different EGMs can have different types and numbers of devices using different types of connectors. Thus, the number and type of connections is provided for the purposes of illustration is for the purposes of illustration only and is not meant to be limiting.

FIGS. 4A, 4B and 4C illustrate top 300 and side views, 330 and 350, of a backplane 114 for an electronic gaming machine, such as 200 in FIG. 2. In FIG. 4A, the board 114 includes connectors 302 for receiving flat extensions from boards within the secure enclosures. The flat extensions can include electrical contacts that interface with connectors 302. The electrical contacts can be utilized for communications and providing power to the circuit boards associated with the GCU, such as the motherboard including the chipset and microprocessor (see FIG. 3). The secure enclosure (see FIG. 1) can be mounted over the connectors 302 to seal the enclosure.

In FIG. 4A, circuitry (not shown) can couple the connectors 302 to other connectors in areas 118 and 120. For example, area 118 includes serial connectors with different number of pins, such as 304, 306 and 308. The serial connectors may be used to communicate with devices, such as touch screens, metering devices, bill validators, printers and other mechanical devices coupled to the EGM. These devices can also use other types of serial connectors, such as USB connectors. In some embodiments, the connectors can include secure covers allowing a connected device to be locked in place and to prevent tampering with the connection.

FIG. 4B shows a side view 330 of the backplane 114 with a view of the connectors in area 120 of FIG. 4A. A circuit board 312 is mounted to structure 314. The structure 314 can be fastened to a wall within the interior of a gaming machine cabinet. The circuit board 312 can provide communication links from the connectors to the connectors 302.

The connectors in area 120 include a plurality of displayport™ connectors, such as 310a and 310b. The displayport connectors allow graphics and sound to be sent to various displays and speakers, such as a main display used to output the wager-based game or secondary displays. Secondary displays can even include displays within input buttons. Other types of connectors, alone or in combination with the displayport connectors can be used, such as mini display port, HDMI, USB, DVI, lightning and VGA. Thus, this example is provided for the purposes of illustration only and is not meant to be limiting.

FIG. 4C shows a side view 350 of the backplane 114 with a view of the connectors in area 118 of FIG. 4A. Four VGA video connectors, such as 316, two Ethernet connectors, such as 318, and four USB connectors, such as 320 are visible. The Ethernet connectors can allow wired communications with remote servers. Wireless communications with remote device and local devices, such as a player's smart phone or tablet are possible and the example of wired communications is provided for the purposes of illustration only. Again, the game controller 250 in FIG. 3 can access these connectors via connectors 302 shown in FIG. 4A.

Figure 5A:
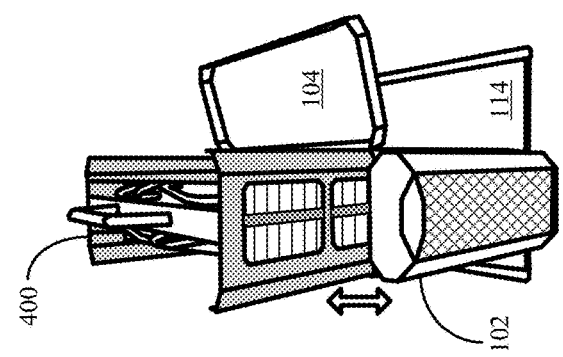
FIG. 5A illustrates a top view of a game controller unit in accordance with embodiments of the present invention.
Figure 5B:
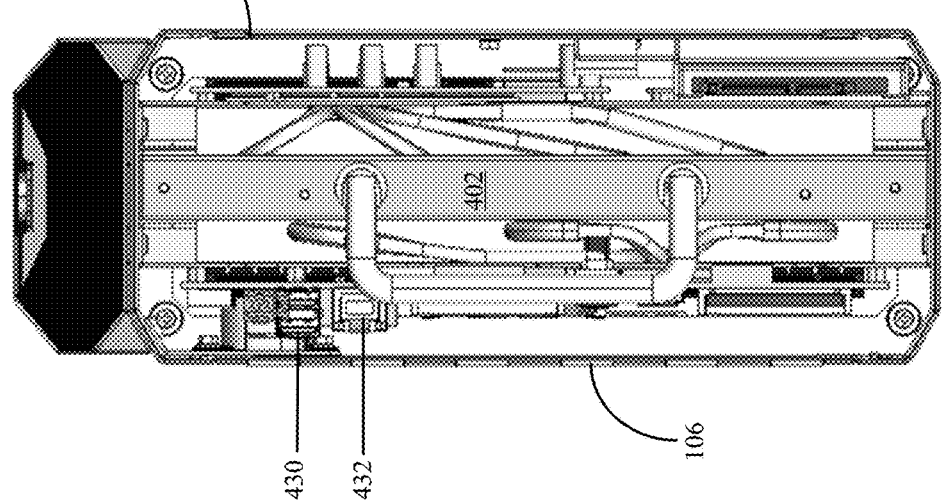
FIG. 5B illustrates a top view of a game controller unit inserted into a secure enclosure in accordance with embodiments of the present invention.
Figure 5C:
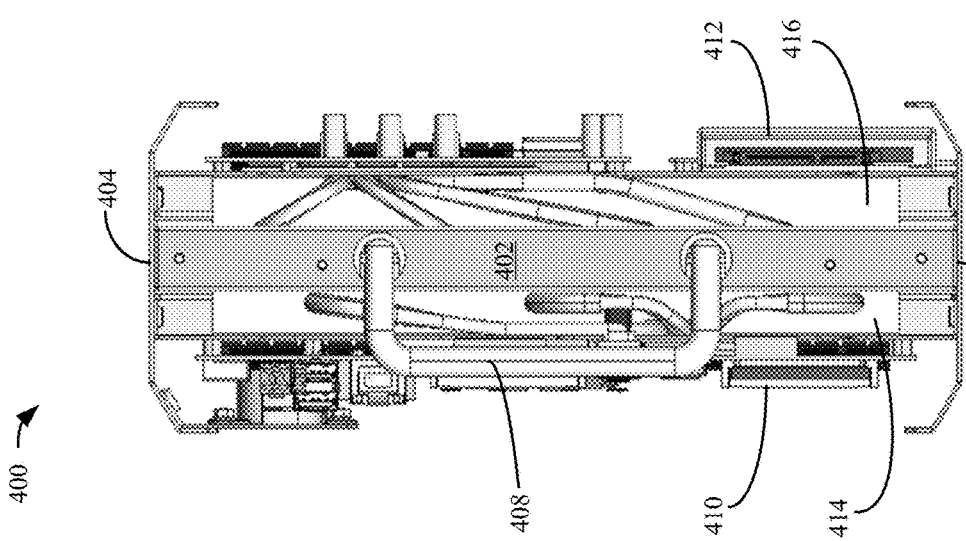
FIG. 5C illustrates a perspective view of a game controller unit partially inserted into a secure enclosure in accordance with embodiments of the present invention.

Next, with respect to FIGS. 5A-5C, a game control unit (GCU) and its interface with the secure enclosure 102 is described. FIG. 5A illustrates a top view of a GCU 400. The GCU 400 includes a frame. The frame includes a center piece 402 which spans a length of the GCU 400 and two end pieces 404 and 406. The frame also includes a bottom piece (not shown). A handle 408, which allows, the GCU 402 to be inserted into or removed from the secure enclosure 102 is attached to the frame component 402.

Two heat dissipation units 414 and 416 are coupled to the frame beneath the frame component 402. The heat sinks are disposed within an interior of the GCU 400. Boards, such as 410 and 412 are located on the exterior of the GCU 400. The positioning of boards on the outside of the GCU allows components, such as a graphics card, a processor, memory and a mass storage device to be more easily accessed. For example, when the GCU 400 is not in the enclosure 102, these components can be easily removed or installed on the GCU.

FIG. 5B shows the GCU installed in a secure enclosure 102 with the door 104 removed (see FIG. 5C). The door 102 is attached to hinge 106. When the enclosure 102 is secured to the backplane 114, as shown in FIG. 5C, the connectors 302 are located at the bottom of the secure enclosure 202. The GCU 400 is inserted into the enclosure 102 such that contact is made between electrical contacts associated with the boards on the outside of the GCU. In this position, the boards, which form the game controller 250 (see FIG. 3), can receive power from the backplane and communicate with the various devices coupled to the backplane. In addition, the game controller can communicate with remote devices via the remote communication interfaces, such as the Ethernet connection.

FIG. 5C shows the GCU partially inserted into the enclosure 102. The frame components 404 and 406 are shaped such that the GCU 400 can be installed in only one orientation. This ensures that the electrical contacts from the boards align with the connectors 302 on the backplane in FIG. 4A. Once the GCU 400 is fully inserted into the enclosure 102, door 104 can be closed and then secured with a lock. As described above, when the GCU 400 is installed in the secure 102 or removed from the enclosure, it may have to be done in the present of multiple security and/or regulatory officials.

In FIG. 5B, two USB terminals, such as 430, and an Ethernet terminal 432 are exposed. Via the USB terminals or the Ethernet terminal, the game controller 250 can be accessed. In various embodiments, the game controller 250 can be accessed for diagnostic purposes, to authenticate software installed on the game controller 250 or to install new software on the game controller 250. For example, a gaming regulator may couple a computer to the game controller 250 to validate game software installed on the game controller 250. Once the software is validated, the door 104 can be closed and locked.

FIGS. 6A, 6B and 6C illustrate side views of a game controller unit 400. In FIG. 6A, frame component 406 is shown. Frame component 406 includes two apertures, 440a and 440b. The two apertures allow air to flow through the frame 406 and enter into fin stacks associated with the heat dissipation units 414 and 416.

Frame component 404 is located on the opposite side of frame component 406. Frame component 404 also includes two apertures, 442a and 442b. The apertures also allow air flow through the heat dissipation units 414 and 416.

The apertures, such as 440a, 440b, 442a and 442b, on frame components 404 and 406 can vary in size, number and shape. For example, a single aperture can be provided on either side or a plurality of smaller apertures can be provided on one or both side sides. The size, number and shape of the apertures on the frame components 404 and 406 can be varied to change the air flow patterns and air flow flux through the heat dissipation units.

In addition, the apertures can be sized and shaped such that access through the apertures to components on the boards 410 and 412 is limited or blocked. In one embodiment, the heat dissipation units substantially fill the apertures and include solid metal sheets to block access to the components on the boards. This feature can help to prevent tampering, such as trying to gain access to the game controller boards via air flow apertures in the secure enclosure, such as when the fans are removed.

FIG. 6B shows side views of the GCU 400 such that the boards 410 and 412 are visible. Board 410 can include slots for a CPU 426, a BIOS 424 and slots for RAM 430. Board 412 can include a slot for a GPU 428 and a mass storage unit 422. The mass storage unit can be a persistent memory, such as a hard drive or a flash drive. A non-volatile memory unit, such as a battery-packed NV-RAM (not shown), can also be coupled to one of the boards.

The mass storage unit can store the game software executed by the game controller 250. In its location on the outside of the GCU 400, the mass storage unit 422 can be easily accessed. This position allows the mass storage unit 422 to be easily installed or replaced. For example, the mass storage unit 422 can be swapped with another mass storage unit to change the game software executed on the gaming machine, such as the type of game which is played.

Thermal Management System

Next details of the thermal management system associated with the GCU and secure enclosure are described with respect to FIGS. 7A-9B. The thermal management can be configured to remove heat from the secure enclosure including the GCU such that the components associated with the GCU don't overheat. Within the GCU, electrical components such as the CPU and GPU generate the most heat. The heat dissipation units are designed to pull heat away from these components. Then, fans coupled to the secure enclosure pump in cooler air and vent the heated air to help keep the GCU components cool.

The thermal management system can also be designed to provide a certain level of air quality. Casino environments can be smoky and dusty. Smoke and dust can reduce the expected lifetime of electrical components. Thus, filters can be provided which reduce an amount of smoke and dust particles that enter the enclosure.

Finally, the thermal management system can also be designed with both security and maintenance in mind. Towards this end, thermal management components can be positioned and air flow pathways can be designed such that critical components within the secure enclosure are not exposed to tampering. Some examples of this component positioning have already been described above with respect to FIGS. 6A and 6C.

In addition, the thermal management components can be designed to be easily maintainable while not comprising overall security of this system. In particular, which is described in more detail below, components, such as the fans and their associated enclosure, can be designed such that it is possible to maintain and replace them without exposing critical components such as the game controller to tampering. Thus, it may be possible to maintain the fans without the presence of security personnel. Details of these designs are described as follows.

Components, such as FIGS. 7A and 7C illustrate top 500 and bottom 520 views of a secure enclosure 102 including a game control unit 400 and FIG. 7B illustrates a cross section 510 of the GCU 400 and the enclosure 102. In FIG. 7A, air, 502a and 504a, which can be inside a gaming machine cabinet, can enter the top of the enclosure 102. The enclosure 102 can include a fan cover 112 with a plurality of apertures. The air 502a and 504a can pass through these apertures.

In FIG. 7B, cross sections of two fans 506a and 506b are shown. In one embodiment, the fans can be configured to pull air into the enclosure 102 so that the air is pulled through the fan cover 112 as shown in FIG. 7A. The direction of the air flow is indicated by arrows 502b and 504b.

In another embodiment, the fans can be configured to push air out of the enclosure 102. In this embodiment, the direction of the arrows in FIGS. 7A, 7B and 7C can be reversed. In some embodiments, the fans, such as 502b and 504b can be configured to operate in either direction, sometimes pulling air through fan cover 112, and other times pushing air out of fan cover 112. In various embodiments, the fans can be a single speed or can be multi-speed fans.

In one embodiment, the fans can be DC brushless fans. The dimensions can be about sixty mm by sixty mm by twenty five mm. The fans, 502b and 504b, can be configured to operate on nominally twelve Volts of direct current with current of about one hundred fifty five milliamps. The fans rotate in a counter-clockwise direction with a nominal rotation rate of about 6000 RPM. The fan operational temperature range of -ten to seventy degrees C. The air flow for the fans is 27.8 cubic feet per minute (CFM). The fan casing includes four 4.5 mm mounting holes, which allow the fan to be mounted over mounting posts extending from a bottom of the fan enclosure.

Returning to FIG. 7B, the air flow 502b and 504b enters fans 506a and 506b. The air then passes through apertures in the frame of the GCU (see FIGS. 6A and 6C) and enters into the heat dissipation units (see 414 and 416 in FIGS. 6A and 6B). The heat dissipation units include a plurality of fins, such as 512, and heat pipes, such as 508a and 508b.

The heat pipes carry heat away from hot elements on the circuit boards, such as CPU and GPU. The circuit boards form the game controller. The fins can be formed in a fin stack to dissipate the heat, such as heat carried on the heat pipes. The heat transferred to the fins can be carried away by the air 502c and 504c flowing over the fins. Further details of the heat dissipation units are described with respect to FIGS. 9A and 9B.

Next, the air, such as 502d and 504d, which is now heated, can be pushed through apertures 442a and 442b in the frame of the GCU (see FIG. 6C). Then, the air, 502e and 504e, is pushed through a plurality of apertures in the side 115 of the enclosure 102. The plurality of apertures is arranged into two groups 516a and 516b. The air 502e and 504e from the interior of the enclosure can exit into an interior of the cabinet of the gaming machine.

In particular embodiments, filters can be used at one or more locations within the thermal management system. For example, a filter can be integrated with the fan cover 112. In another embodiment, a filter can be disposed between the fans 506a and 506b and a bottom of an enclosure including the fans (see FIG. 8). In yet another example, filters can cover aperture groups 516a and 516b from an interior (between GCU and enclosure) or exterior position (outside of enclosure).

Figure 8:
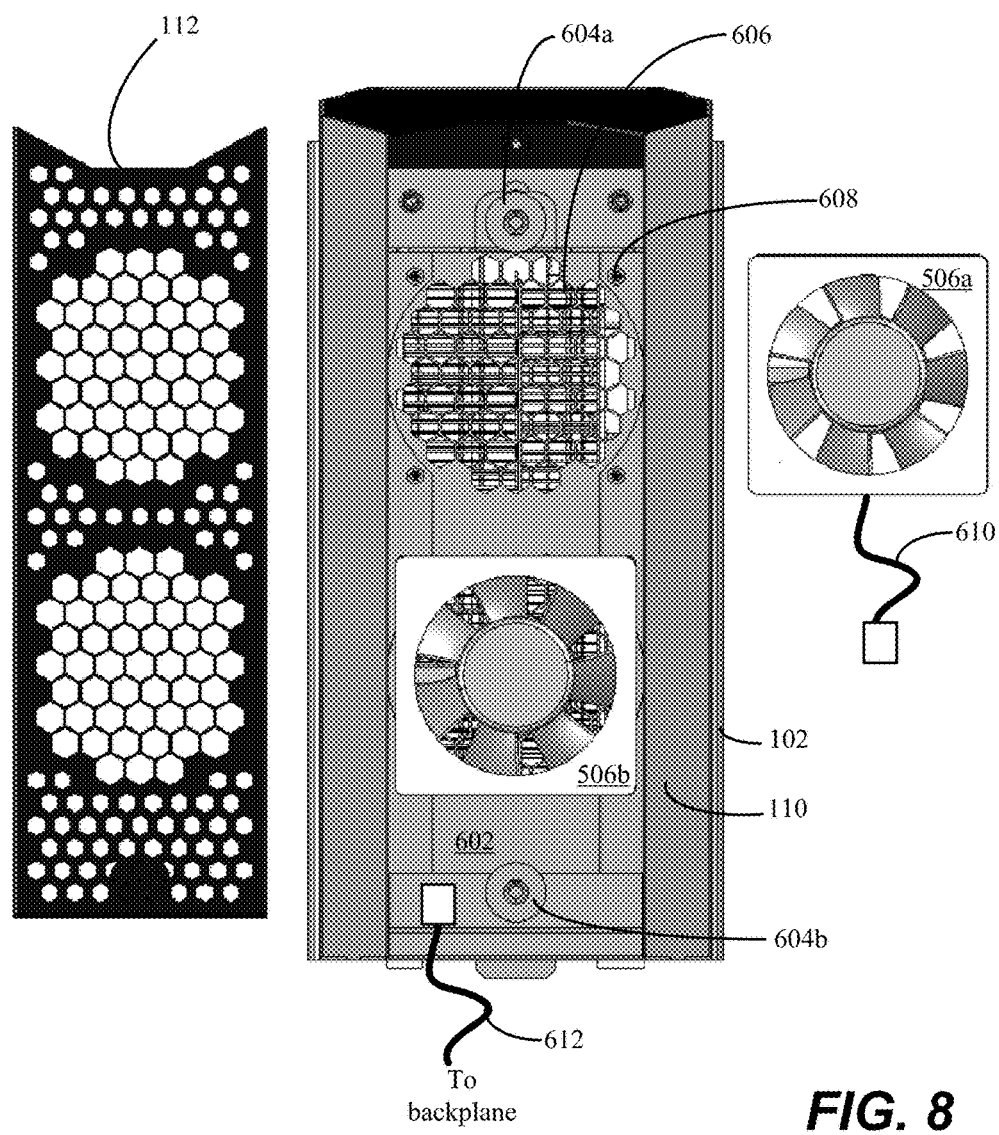
FIG. 8 illustrates a top view of a secure enclosure for a game controller with a cover and fan removed in accordance with embodiments of the present invention.
Figure 9:
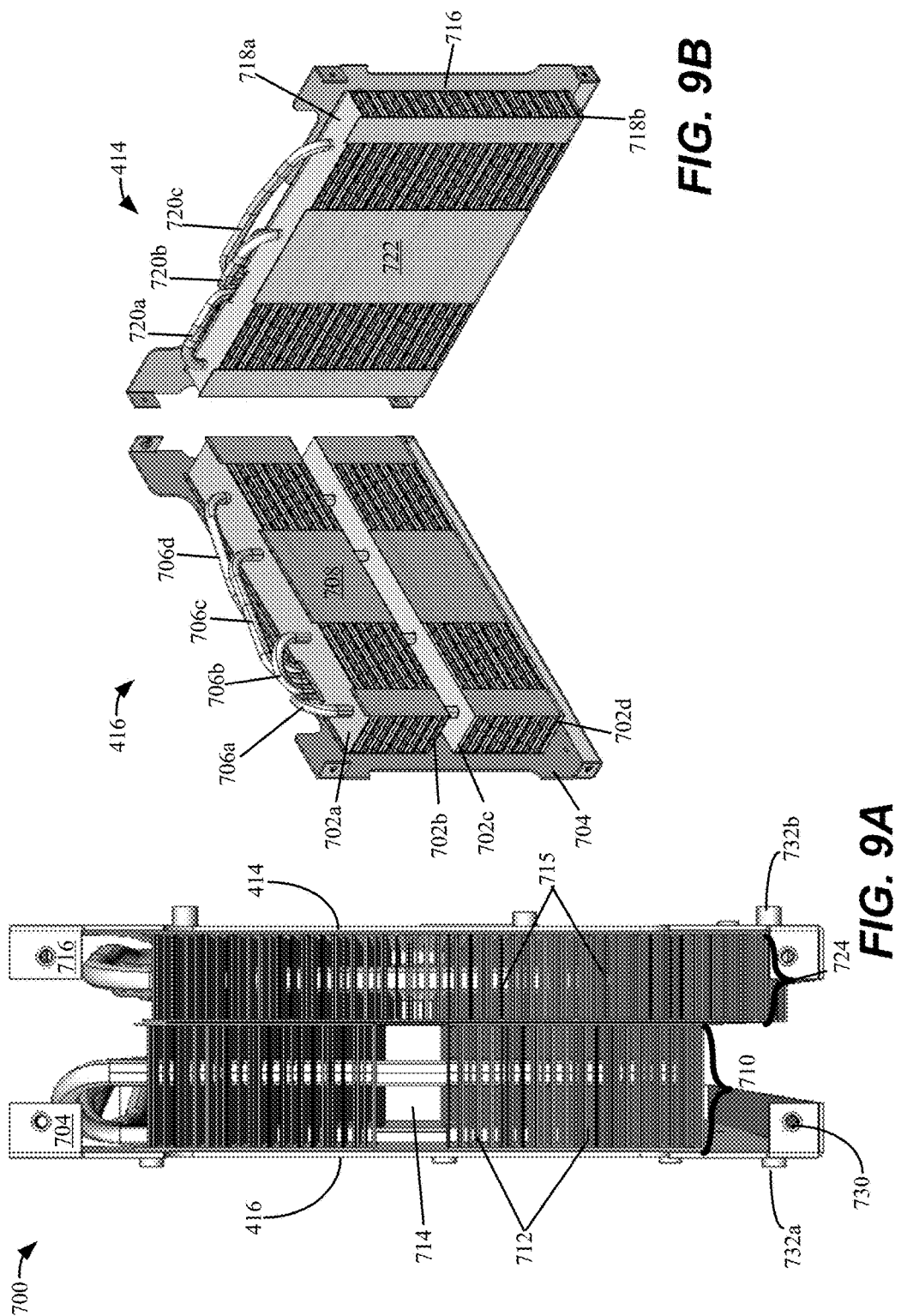
FIGS. 9A and 9B illustrate side and perspective views of heat dissipation units for a game controller unit in accordance with embodiments of the present invention.

Next, with respect to FIG. 8, details of the fan cover 112, fans 506a and 506b, and a fan enclosure 602 are described. In FIG. 8, the fan cover 112 is shown removed from the secure enclosure 102. As described above, the secure enclosure 102 secures the GCU. In addition, a second enclosure 602 is provided to secure the fans 506a and 506b. Thus, the secure enclosure 102 is divided into a first compartment, which receives the GCU via a door, and a second compartment, which is accessed via the fan cover.

The second compartment 602 is separated from the first compartment via a bottom portion formed from a material such as a metal. The bottom portion includes apertures, such as 606. The apertures allow air from the fans to enter or exit the first compartment. A filter and/or metal mesh can be disposed over the apertures between the fan and the bottom portion of the second compartment.

In one embodiment, the fan cover can be removed by hand without the use of tools. For example, magnets, such as 604a and 604b, can be provided. The magnets can be secured to the enclosure 102. The fan cover can be formed from a magnetic material or can include a magnetic material located above the magnets. Thus, the fan cover can be positioned above the magnets by hand and secured in place. Using the magnetic fasteners, the fan cover can be removed by hand without using tools.

In another embodiment, a track can be provided which is configured to receive the fan cover 112. The fan cover can be configured to slide into the track by hand to secure it in place or remove it from the enclosure by hand without using tools. In yet another embodiment, the fan cover can be attached with a fastener, such as mechanical clips. The mechanical clips can be configured to allow the fan cover to be easily popped on attached to the secure enclosure or popped off of the secure enclosure, via hand or with a tool such as flat head screw driver.

Once the fan cover 112 is removed, one or both of the fans 506a and 506b can be removed from the fan enclosure 602. The fan enclosure 602 can include mounting posts for receiving the fans. In this example, four mounting posts, such as 608, are shown. The mounting posts can be inserted into mounting holes in the fan casing of fan 506a.

The fan 506a can be positioned over the mounting posts and lowered to secure the fan into place. If filters and/or a mesh are provided, the filter and/or mesh can be first positioned over the apertures and then the fan 506a can be lowered onto the mounting posts.

In one embodiment, a magnet can be placed on the bottom of the fan 506a. The magnet can secure the fan to the bottom portion of the enclosure. In another embodiment, the force that holds the fan cover 112 in place can also hold the fan 506a in place.

The fan 506a can include a lead and connector 610 for receiving power, control signals and communicating the fan status. In one embodiment, the fan can be configured to be turned on or off. In another embodiment, it can be configured to be always on. Further, the fan can be configured to report its operational status. For example, the fan can be configured to report it is not operational to the game controller. In response, the game controller can be configured to generate a maintenance request.

In one embodiment, one or more lead and connectors s, such as 612, can be provided from the backplane for providing power to the fans. The lead and connector 610 can be configured to interface with the lead and connector 612 from the back plane. In one embodiment, one or more leads and connectors can be passed through a space between the fan cover 112 and the bottom portion of the enclosure 602 where the secure enclosure is mounted to the back plane.

In another embodiment, one or more leads and connectors can be run from outside of the secure enclosure and into the fan enclosure 602. The one or more leads and connectors can be coupled to the backplane. For example, the fan cover 112 can include a gap which allows the wires from a lead and connector to pass into the enclosure. In yet another embodiment, lead and connector 610 can be configured to run from the fan 506a, outside of the enclosure 102 and connect directly to a connector on the backplane and connector 612 may not be provided.

In yet a further embodiment, a power/data connector (not shown) can be built into the enclosure 602. When the secure enclosure 102 is attached to the backplane, an interface can be provided that mates with an interface on the backplane and delivers power to the built-in power data connector. The lead and connector 610 can be coupled to this built-in power/data connector.

In one embodiment, the fans 506a and 506b can be individually installed and replaced. Hence, separate power/data connectors can be provided for each fan. In another embodiment, the fans 506a and 506b can be formed as a single unit, such as via a frame that joins both fans. The single unit can include a single power and data connector that provides power to both fans and receives data from both fans.

In yet another embodiment, when a single unit with one or more fans is provided, as described above in the previous paragraph, the fan unit can be designed to be slid into the secure housing in a manner similar to the GCU, i.e., horizontally slid into the enclosure as opposed to be vertically lifted from the fan enclosure. In this embodiment, the fan enclosure 602 can include a track for receiving the one or more fan units, which are slid into the fan enclosure.

In yet another embodiment, the fan cover can be joined to the fans as a single unit. Thus, when the fan cover is removed, the fans are horizontally lifted from the fan enclosure as a single unit. Then, the fans can be disconnected and then a new fan cover with fan units can be inserted into the fan enclosure. The new fan cover and fan units can then be connected to power and data and operations can be resumed.

In FIG. 8, a joint wall divides the secure enclosure 102 into a first enclosure for receiving the GCU and the second enclosure for receiving the one or more fans. In yet another embodiment, the fan enclosure can be formed as a separate unit from the secure enclosure. The fan enclosure can have an open bottom or can have its own bottom wall separate from a wall that forms the secure enclosure.

The fan enclosure and fans can be designed to be removed and attached to the secure enclosure as a single unit. Thus, during operation a first fan enclosure including one or more fans can be coupled to the secure enclosure and coupled to power and/or data connectors, such that the fans are powered. When maintenance is required, the first fan enclosure and fans can be decoupled from the secure enclosure and replaced with a second fan enclosure. Then, if desired, maintenance can be performed on the first fan enclosure at a location away from the EGM, such as to clean it and/or replace one or both fans in the enclosure.

An advantage of having the secure enclosure partitioned into two parts, i.e., a first compartment for the GCU and a second compartment for the fans, is the fans can be maintained without compromising the security of the GCU. Thus, fans can be cleaned and/or replaced without the need for the full security that is entailed when the game controller on the GCU is accessed. If the fans were located within the compartment with the GCU, then replacing the fans would require a full security complement because of the possibility of tampering with the game hardware or software on the GCU. Thus, this approach reduces the costs associated with fan maintenance.

When fans require maintenance, the EGM remains inoperable and hence it is not generating revenue. The addition of an easily removable fan cover, such as a fan cover attached via magnetic fasteners, hastens the maintenance process. Thus, the costs associated with lost revenue due to EGM down-time can be reduced.

Next, details of the heat dissipation units, 414 and 416, are described. FIGS. 9A shows view from the side of the heat dissipation units 414 and 416 as installed in a GCU. FIG. 9B show a perspective view where the dissipation units are pulled apart.

The units, 414 and 416, each include a frame, such as 704 and 716. The frames can be a sheet of metal, such as but not limited to stainless steel. The frames, 704 and 716, can include mounting tabs, such as 730 for attaching the heat dissipation unit to the frame of the GCU. In addition, the frames, 704 and 716, can include mounting points, such as 732a and 732b, for attaching boards associated with the game controller. For instance, a motherboard and a GPU board are shown mounted to an exterior portion of frames, 704 and 716 in FIGS. 5A and 6B.

On the side opposite of the mounting points for the circuit boards are heat pipes and fin stacks. Heat dissipation unit 416 includes fins, such as 712. On 416, the fins are separated into two groups with a first group having a top fin 702a and a bottom fin 702b and a second group having a top fin 702c and a bottom fin 702d. A gap 714, which is larger than the fin spacing between either of the first or second group, is disposed between the two fin groups. The fins in each group are substantially perpendicular to frame 704.

In various embodiments, the spacing between the fins in the first group and the second group can be approximately the same or different between the groups. In one embodiment, the gaps between the fins are approximately the same within the fins of the first group and the second group. In another embodiment, spacing between the fins can vary within each of the fin groups.

The fins in each of the two groups can be angled so that the fins are not perpendicular to the frame 704. The fin angle can be same for each fin or can vary from fin to fin. Also, the fin angle can be the same in each group but can vary between each of the two fin groups. For example, the fins in a first group can be angled downward while the fins in the second group can be angled upward.

The size of the gap 714 and the number of fins in each group can depend on the amount of heat expected from the circuit components mounted to the heat dissipation unit. The number fins can be reduced and the gap size increased as heating load is reduced. Reducing the number of fins can decrease the weight of the device and reduce production costs. As the heating load increases, the gap size 714 can be reduced. If necessary, to accommodate a desired heating load, the gap 714 can be eliminated and a single fin stack, such as shown on heat dissipation unit 414 can be provided.

A spacing is provided between frame 704 and frame 716 of the heat dissipation units 414 and 416. The spacing is divided into a first portion 710 and a second portion 724. In this example, the first portion 710 is larger than the second portion 724. The heat dissipation units touch so that all of the spacing is used. The division between the first portion and the second portion can be varied depending on the heating load expected to be experienced by each of the heat dissipation units. Thus, GCUs with different components that emit more or less heat can be accommodated without changing the overall dimensions of the GCU.

The heat dissipations each can include a number of heat pipes. The heat pipes in each of the heat dissipation units pass by a hot area associated with one of the electrical components, such as the CPU or GPU and then fan out into the fin stacks. This arrangement allows the heat to be more efficiently dissipated to air which is flowing through fins as a result of the fans driving air through the system.

The heat pipes can be a metal of some type or some other material which efficiently conducts heat. For example, stainless steel or copper. In some embodiments, the heat pipes can be solid. In other embodiments, the heat pipes can be hollow. In one embodiment, each heat pipe can be arranged in a loop.

In heat dissipation unit, 414, three heat pipes 720a, 720b and 720c, are used. In heat dissipation unit, 416, four heat pipes, 706a, 706b, 706c and 706d are used. In FIG. 9B, the heat pipes are off set from one another between the heat dissipation units. Thus, the heat pipes in unit 414 are generally positioned in the gaps between the heat pipes associated with unit 416. This arrangement can more efficiently dissipate the heat generated by both units. The number of heat pipes used in each heat pipe and the diameter of each of the heat pipes which are used can be varied depending on the expected heat loads to each of the heat dissipation units. For example, three heat pipes can be used on both units or three heat pipes can be used on one unit and two heat pipes used on the other unit. In another example, one or both of the heat dissipation units may not use heat pipes.

Metal strips, such as 708 and 722, may be placed on the outside of the fin stacks. The metal plates secure the fins in place. The metal plates don't totally cover the gaps between the fins. Thus, air can flow crosswise from the first heat dissipation unit to the second heat dissipation unit. The metal plates line up on each of the heat dissipation units and can be in contact with one another when the heat dissipation units are installed within the GCU.

Next, a method of replacing of performing maintenance on an EGM is described. FIG. 10 illustrates a method 800 of replacing a fan coupled to a secure enclosure for a game control unit. In 802, the EGM cabinet door can be opened. In 804, without opening and/or unlocking the secure enclosure having the GCU, the fan cover to the fan cover can be removed. In one embodiment, the fan cover can be decoupled from the magnetic fasteners.

In 806, a fan can be removed from the fan enclosure and decoupled from a power and/or data coupling. In one embodiment, the fan can be lifted off of mounting posts. In addition, filters and/or a metal mesh, disposed between the fan and the bottom of the fan enclosure, can also be removed, cleaned and/or replaced.

In 808, a new fan can be attached to a power and/or data coupling and mounted in the fan enclosure. In 810, the fan cover can be coupled to the secure enclosure. For example, the fan cover can be positioned over magnets to fasten the cover to the secure enclosure. In 812, the gaming machine cabinet door can be closed and the EGM can initialize to an operational mode.

Next, a method of forming an EGM is described. FIG. 11 illustrates a method 900 of forming game controller unit including CPU and GPU boards and CPU and GPU heat sinks. In 902, the location of various electrical components within the GCU and the heat load associated with the components can be determined. Typically, the CPU, GPU and the mass storage device, such as a hard disk drive or flash drive, generate the most heat. The amount of heat varies with activity. For example, more heat is generated when a game is actively being generated than when an EGM is in a minimal activity state.

Next, based upon the anticipated heat loads for the various electrical components, two heat dissipation units can be designed. First, in 904, the number, placement and thickness of the heat pipes in each of the heat dissipation units can be determined. The heat pipes can be placed near the locations where the most heat is emitted. These locations will depend on where components, such as the CPU and GPU are located. Typically, the CPU and GPU can be located on opposite sides of the GCU where a first heat dissipation unit dissipates heat from the CPU and a second heat dissipation unit dissipates heat from the GPU.

The heat pipes can be spread out from the locations where heat is being emitted to allow the heat carried by the heat pipes to be dissipated within the fins associated with the heat dissipation units. The locations of the heat pipes in the first heat dissipation unit can account for the locations in the second heat dissipation unit. In particular, the locations of the heat pipes in each of the units can be selected so that they are offset relative to one another so that the heat pipes from the two different units don't dump their heat at the same location.

Next, in 906, based upon the expected heat loads and heat pipe locations, the number of fins, fin spacing, fin angles and fin groupings can be determined for each of the heat dissipation units. Further, as described above, a spacing width between the boards associated with the GPU and CPU is provided which is occupied by the two heat dissipation units. Based upon the heat loads, one of the heat dissipation units can be wider than the other heat dissipation unit. In 906, the width of the each of the heat dissipation units can also be determined.

In 908, the first and second heat dissipation units can be formed with the heat pipe locations and determined fin design. In 910, fans can be selected. The fans can be selected to drive a certain amount of air through the heat dissipation units as a function of time.

In 912, the first heat dissipation unit and the second dissipation unit can be mounted to a frame associated with the GCU. The heat dissipation units form an interior core of the GCU where an air flow path is provided through the core. The one or more fans drive air through the core. Then, electrical boards, such as the electrical boards including the CPU and GPU can be mounted to the outside of the heat dissipation units. Other electrical components, such as the mass storage device and the non-volatile memory can also be coupled to the outside of the heat dissipation units.

Next, in 914, a backplane can be mounted to an interior surface within the gaming machine cabinet. The secure enclosure can be mounted to the backplane. The backplane includes a plurality of connectors. Various gaming devices associated with the EGM can be coupled to the connectors.

In 916, a game control unit can be installed within the secure enclosure. In particular, a door of the secure enclosure can be opened and the game control unit can be slid into the secure enclosure. Then, the door to the secure enclosure can be closed and locked if desired. Next, the EGM can start up and enter into an operational state where game play is available on the EGM. A game controller on the GCU can control play of a wager-based game on the EGM.

Because such information and program instructions may be employed to implement the systems/methods described herein, the present invention relates to tangible, machine readable media that include program instructions, state information, etc. for performing various operations described herein. Examples of machine-readable media include hard disks, floppy disks, magnetic tape, optical media such as CD-ROM disks and DVDs; magneto-optical media such as optical disks, and hardware devices that are specially configured to store and perform program instructions, such as read-only memory devices (ROM) and programmable read-only memory devices (PROMs). Examples of program instructions include both machine code, such as produced by a compiler, and files containing higher level code that may be executed by the computer using an interpreter.

Although many of the components and processes are described above in the singular for convenience, it will be appreciated by one of skill in the art that multiple components and repeated processes can also be used to practice the techniques of the present disclosure.

While the present disclosure has been particularly shown and described with reference to specific embodiments thereof, it will be understood by those skilled in the art that changes in the form and details of the disclosed embodiments may be made without departing from the spirit or scope of the invention. It is therefore intended that the invention be interpreted to include all variations and equivalents that fall within the true spirit and scope of the present invention.

What is claimed is:

1. A system comprising:
   an enclosure including two compartments wherein a first compartment is accessed via a door including a locking mechanism and wherein a second compartment is secured via a cover;
   a game control unit, disposed within the first compartment of the enclosure, including a frame, two heat dissipation units coupled to the frame, a plurality of electrical circuit boards forming a game controller, coupled to an outside of the heat dissipation units adjacent to walls of the enclosure,
   wherein the game controller includes a CPU, GPU, RAM, BIOS and a mass storage device storing game software and wherein the game controller executes the game software to control a wager-based game played on an electronic gaming machine;
   a first fan disposed within the second compartment; and
   a first plurality of apertures, between the first compartment and the second compartment, which allow air driven by the first fan, to move between the first compartment and the second compartment to cause heat from the heat dissipation units to be removed from the first compartment;
   wherein the heat dissipation units in the first compartment are disposed adjacent to a first side of the first plurality of apertures such, such that when the door to the first compartment is locked via the locking mechanism and the cover and the first fan is removed from the second compartment for servicing the first fan, the game controller is not exposed to tampering allowing the first fan to be serviced by a service technician without a presence of security personnel.

2. The system of claim 1, wherein the cover is attached via magnets, allowing the cover to be removed by hand.

3. The system of claim 1, wherein the cover is configured to be slid into a track, allowing the cover to be removed by hand.

4. The system of claim 1, wherein the cover includes a second plurality of apertures allowing air to move between outside of the enclosure and the second compartment.

5. The system of claim 1, further comprising a second fan and a second plurality of apertures, between the first compartment and the second compartment, which allow air driven by the second fan, to move between the first compartment and the second compartment to cause heat from the heat dissipation units to be removed from the first compartment.

6. The system of claim 5, further comprising a frame which couples the first fan to the second fan to allow the first fan and the second fan to be removed as a single unit.

7. The system of claim 1, wherein the first fan is coupled to the cover to allow the first fan and the cover to be removed as a single unit.

8. The system of claim 1, wherein the second compartment is formed from the cover and sidewalls and the second compartment is detachable from the enclosure.

9. The system of claim 1, wherein the cover includes an aperture which allows a power connector for the first fan to enter from outside enclosure and into the second compartment.

10. The system of claim 1, further comprising a power and data connector located inside of the second compartment, configured to provide power and provide communications with the fan, wherein wires to the power and data connector are routed outside of the first compartment.

11. The system of claim 1, further comprising one or more mounting posts perpendicular to a bottom of the second compartment configured to receive the fan.

12. The system of claim 1, further comprising a filter disposed between a bottom of the fan and the first plurality of apertures.

13. The system of claim 1, wherein the frame of the game control unit is configured such that it only mechanically fits into the first compartment of the enclosure when it is in a first orientation.

14. The system of claim 1, wherein the first fan is magnetically secured to the enclosure.

15. The system of claim 1, further comprising a backplane wherein the backplane is configured to mount to a wall of a cabinet of the electronic gaming machine and wherein the enclosure is mounted to the backplane.

16. The system of claim 15, further a power and data connector running from the backplane to the first fan wherein the power and data connector are routed outside of the first compartment.

17. A method of servicing an electronic gaming machine (EGM) including a cabinet comprising:
providing an enclosure including two compartments, secured within an interior portion of the cabinet of the EGM, wherein a first compartment is accessed via a door including a locking mechanism and wherein a second compartment is secured via a cover; 2) a game control unit, locked, via the locking mechanism, within the first compartment of the enclosure, including a frame, two heat dissipation units coupled to the frame, a plurality of electrical circuit boards forming a game controller, coupled to an outside of the heat dissipation units adjacent to walls of the enclosure, wherein the game controller includes a CPU, GPU, RAM, BIOS and a mass storage device storing game software and wherein the game controller executes the game software to control a wager-based game played on the EGM; 3) a first fan disposed within the second compartment; and 4) a first plurality of apertures, between the first compartment and the second compartment, which allow air driven by the first fan, to move between the first compartment and the second compartment to cause heat from the heat dissipation units to be removed from the first compartment; wherein the heat dissipation units in the first compartment are disposed adjacent to a first side of the first plurality of apertures, such that when the door to the first compartment is locked via the locking mechanism and the cover and the first fan is removed from the second compartment for servicing the first fan, the game controller is not exposed to tampering;
opening a door to the cabinet;
while the door to the first compartment remains locked with the game control unit secure in the first compartment, removing the cover to the second compartment;
removing the first fan from the second compartment;
replacing the first fan with a second fan;
placing the cover over the second compartment; and
closing the cabinet.

18. The method of claim 17, wherein the cover is magnetically coupled to the enclosure allowing the cover to be removed by hand.

19. The method of claim 17, wherein the enclosure includes a slot for receiving the cover to allow the cover to be slid off by hand.

20. The method of claim 17, wherein the second compartment includes one or more mounting posts extending perpendicularly from a bottom of the second compartment, further comprising removing the first fan from the mounting posts and placing the second fan over the mounting posts to secure the second fan to the enclosure.

* * * * *